United States Patent
Rohrbach

(10) Patent No.: US 8,824,166 B2
(45) Date of Patent: Sep. 2, 2014

(54) MAGNETIC STAND FOR TABLET DEVICE

(75) Inventor: Matthew D. Rohrbach, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 384 days.

(21) Appl. No.: 13/223,110

(22) Filed: Aug. 31, 2011

(65) Prior Publication Data

US 2013/0050973 A1   Feb. 28, 2013

(51) Int. Cl.
*H05K 9/00* (2006.01)

(52) U.S. Cl.
USPC .............................. 361/816; 248/683; 248/467

(58) Field of Classification Search
USPC ............. 361/816; 248/683, 467, 206.5, 309.4
See application file for complete search history.

(56) References Cited

U.S. PATENT DOCUMENTS

| | | | |
|---|---|---|---|
| 5,839,186 A | 11/1998 | Onodera | |
| 6,386,413 B1 * | 5/2002 | Twyford | 224/553 |
| 6,700,775 B1 * | 3/2004 | Chuang et al. | 361/679.01 |
| 6,816,751 B1 | 11/2004 | Alice et al. | |
| 7,356,176 B2 | 4/2008 | Fujii et al. | |
| 7,541,907 B2 * | 6/2009 | Wang et al. | 335/305 |
| 7,984,886 B2 * | 7/2011 | Lin | 248/181.1 |
| 8,253,518 B2 * | 8/2012 | Lauder et al. | 335/219 |
| 8,289,115 B2 * | 10/2012 | Cretella et al. | 335/219 |
| 8,459,599 B2 * | 6/2013 | Du et al. | 248/181.1 |
| 2005/0086800 A1 | 4/2005 | Heidel | |
| 2006/0075934 A1 * | 4/2006 | Ram | 108/44 |
| 2007/0034753 A1 * | 2/2007 | Lee | 248/121 |
| 2009/0091881 A1 * | 4/2009 | Lee et al. | 361/679.21 |
| 2010/0102182 A1 * | 4/2010 | Lin | 248/206.5 |
| 2010/0133409 A1 * | 6/2010 | Park et al. | 248/470 |
| 2010/0237206 A1 * | 9/2010 | Barker | 248/206.5 |
| 2010/0254111 A1 | 10/2010 | Ligtenberg et al. | |
| 2010/0308187 A1 * | 12/2010 | Lin | 248/206.5 |
| 2011/0064401 A1 | 3/2011 | Desorbo | |
| 2011/0170252 A1 | 7/2011 | Jones et al. | |
| 2013/0103236 A1 * | 4/2013 | Mehrgan | 701/22 |
| 2013/0144463 A1 * | 6/2013 | Ricci et al. | 701/1 |

FOREIGN PATENT DOCUMENTS

| | | |
|---|---|---|
| EP | 1 668 600 | 9/2009 |
| WO | 2011083492 | 7/2011 |

OTHER PUBLICATIONS

"Apple iPad 2 adds cameras and Smart Cover", Jessica Dolcourt and James Martin, CNET News, Mar. 3, 2011, 12 pages, http://www.zdnet.co.uk/news/mobile-devices/2011/03/03/apple-ipad-2-adds-cameras-and-s . . . , downloaded Aug. 9, 2011.

* cited by examiner

*Primary Examiner* — Forrest M Phillips
(74) *Attorney, Agent, or Firm* — Womble Carlyle Sandridge & Rice LLP

(57) ABSTRACT

A magnetic stand for a tablet device is disclosed. The magnetic stand is configured to rigidly hold a portion of the tablet device in place and to shield the magnetic field from adversely affecting nearby devices susceptible to strong magnetic fields. The shielding portion of the magnetic stand allows for significant increases in magnetic field strength when compared to similarly configured, unshielded products.

20 Claims, 5 Drawing Sheets

MAGNETIC STAND FOR TABLET DEVICE

BACKGROUND

1. Field of the Described Embodiments

The described embodiments relate generally to an apparatus for supporting a tablet device. In particular an apparatus for magnetically attaching a tablet device to a supporting structure is disclosed.

2. Related Art

Tablet devices are used in an increasingly wide range of applications. In many of these applications a way for conveniently mounting the device is required. A number of manufacturers have tried to produce such a device; however since most tablets have no built in mounting mechanism, mounting devices tend to be somewhat cumbersome and generally do not allow for easy removal.

Therefore, what is desired is a way for securely attaching a tablet device to a stand where it can be removed and replaced with ease.

SUMMARY OF THE DESCRIBED EMBODIMENTS

The paper describes many embodiments that relate to an apparatus for magnetically supporting a tablet computer.

A stand for magnetically securing a tablet device is disclosed. The tablet device has a magnetic attachment system disposed within a first portion of a tablet device housing. The stand includes the following components: (1) a cupped portion, and (2) a magnetic attachment mechanism. The cupped portion has an interior with a size and shape arranged to accommodate the first portion of the tablet device by providing a friction force to an exterior surface of the tablet device housing. The magnetic attachment mechanism includes a magnetic element for magnetically interacting with the magnetic attachment system, the magnetic interaction causing the cupped portion to secure the tablet device.

In a particular embodiment, a metallic shunt portion is attached to an exterior surface of the magnetic element for redirecting a portion of a magnetic field emanating from the magnetic element towards the interior of the cupped portion thereby increasing the magnetic interaction. The magnetic shunt portion also secures the magnetic element within the cupped portion.

A magnetic mount for releasably securing a tablet device to a vehicle console is disclosed. The magnetic mount includes the following components: (1) a mounting connector compatible with a vehicle attachment point on the vehicle console; (2) a metallic shunt which positions a plurality of permanent magnets within the magnetic mount, and prevents a magnetic field emanating from the permanent magnets from leaking energy out of the back or sides of the magnetic stand; (3) a specific magnetic signature built into at least one of the plurality of permanent magnets, wherein the tablet device can recognize the magnetic signature as being attached to a vehicle mount; and (4) a cupped portion arranged to provide a friction force for rigidly supporting at least one side of the tablet device, and a structure for shielding the magnetic field emanating from the permanent magnets while the magnetic stand is not in use, where the metallic shunt is mechanically attached to a bottom outer surface of the cupped portion and furthermore where the magnetic field acts to hold a portion of the tablet device securely within the cupped portion.

A detachable motor vehicle communication system is disclosed. The system includes: a tablet device and a stand for detachably securing the tablet device to an interior surface of the motor vehicle. The tablet device includes a display for presenting visual information, a wireless communication interface, and a magnetic attachment mechanism. The stand includes: a magnetic attachment unit that interacts with the tablet's magnetic attachment mechanism to secure the tablet device and the stand. The tablet device also includes a sensor which senses that the tablet device is secured to the stand causing the tablet device to automatically interact with the motor vehicle in a wireless mode.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION OF EXAMPLE EMBODIMENTS

Representative applications of apparatuses and methods according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Tablet devices are used in an increasingly wide range of applications. In many of these applications a way for conveniently mounting the device is required. A number of manufacturers have produced mechanical devices to accomplish this purpose; however since most tablets have no built in mounting mechanism the mounting device tends to be somewhat cumbersome and not easily removable. For example, in an upscale restaurant that has switched from paper menus and waiters to a tablet based ordering system customers might prefer to remove the tablet device from its stand while they peruse the menu. Forcing the diners to remove the tablet from a complex mechanical contraption will probably detract from the overall experience. It might even contribute to some of the tablet devices being dropped or damaged. Although most tablets do not include external attachment features, the iPad® 2 manufactured by Apple Inc. of Cupertino, Calif. does include magnetic attachment points. The magnetic attachment points have been used nearly exclusively for attaching foldable cover attachments to one side of a tablet device enclosure. Although the foldable cover attachments do conveniently protect the screen from damage, they are not particularly compatible for use as a mounting system. This issue can be overcome by designing a more rigid attachment accessory configured to match up with the magnets built into the tablet device.

Figure 1A:
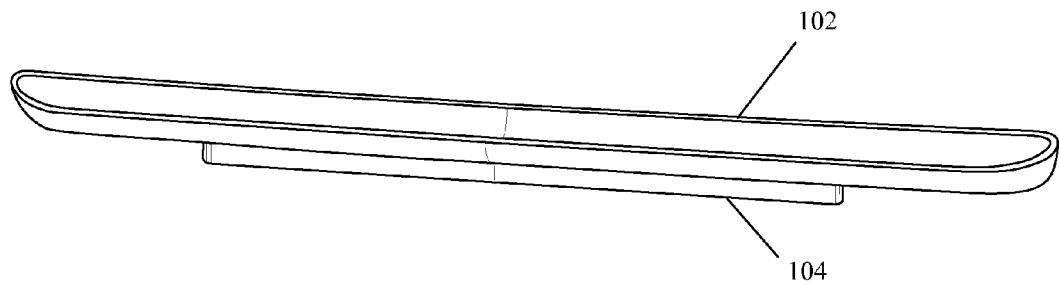
FIG. 1A shows a perspective view of a magnetic stand in accordance with the described embodiments.
Figure 1B:
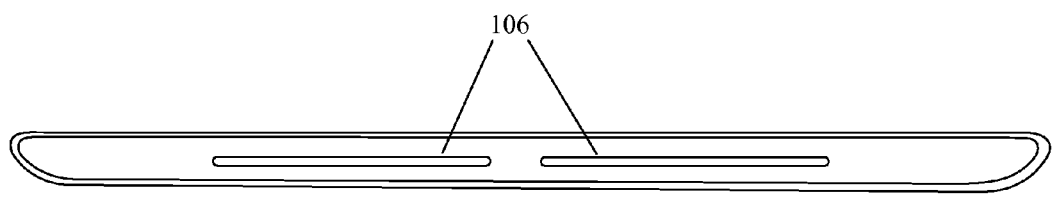
FIG. 1B shows a top view of a magnetic stand in accordance with the described embodiments.

FIGS. 1A and 1B show one such rigid embodiment. FIG. 1A shows a perspective view of one embodiment of a magnetic stand, where a cup portion 102 is configured to slide over a long end of a tablet device and a metallic shunt portion 104 is rigidly attached to the bottom of cup portion 102, which position magnets (not shown) on the bottom side of cup portion 102. Metallic shunt portion 104 also functions to prevent magnetic energy from leaking out of the bottom or sides of the magnetic stand. Cup portion 102 can conform to the long end of the tablet device and creates a rigid structure to hold a tablet device in place. FIG. 1B shows a top view of the embodiment. In FIG. 1B magnetic elements 106 are shown and arranged in a configuration to match up with magnets built into a tablet device. One challenge of providing a strong enough attachment to the tablet is that a stronger field is larger and can have detrimental effects on nearby magnetized objects such as the magnetic stripes on credit cards and bus passes. The described embodiment addresses these challenges in two ways. First the magnets can be rare-earth magnets. Neodymium magnets (the strongest type of rare-earth magnets) in particular can be configured with a large magnetic field, and that field can be channeled into a well defined directional pattern. Additionally the magnetic field strength can be configured to decrease dramatically at the end of the designed field area, vice being allowed to slowly diminish and potentially unpredictably affect items farther away. Second the position of the magnets at the bottom of the cup portion effectively shields the magnetic field from inadvertent interaction with other objects. A further precaution can be taken to avoid effects on neighboring magnetic objects. Spring mounted doors can be installed on the opening to the cup portion to prevent sensitive magnetic objects from inadvertently entering the cup portion and being adversely affected, while still allowing a tablet device to be pushed through and securely seated.

Figure 1C:
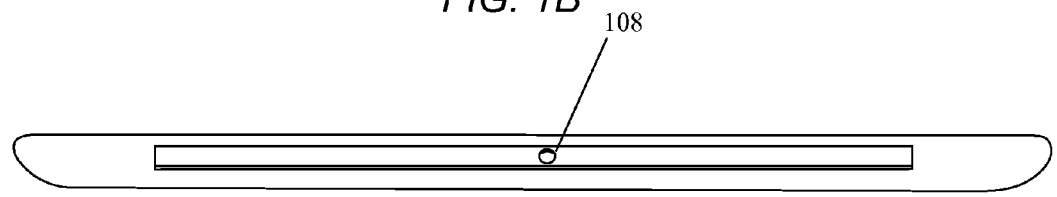
FIG. 1C shows a bottom view of a magnetic stand in accordance with the described embodiments.
Figure 1D:
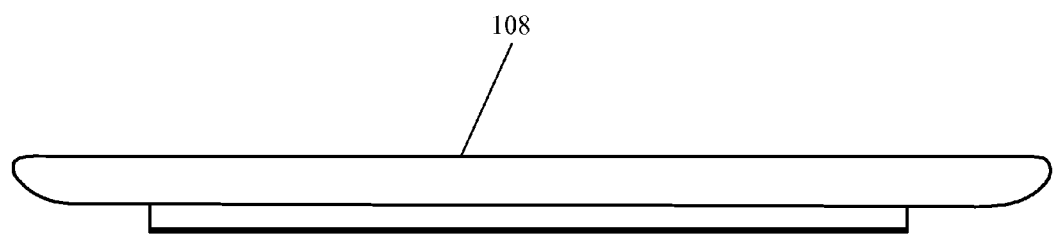
FIG. 1D shows a front view of a magnetic stand in accordance with the described embodiments

FIG. 1C shows a bottom view of the described embodiment. In this view mounting connector 108 is visible. This can be a quarter inch threaded hole as shown in the figure for allowing for easy mounting on existing accessory devices. Mounting connector 108 could also take the form of a clip, clamp, suction cup, or any other means of attachment. Mounting connector 108 allows a tablet device to be placed in a number of orientations and locations, and because of the nature of the magnetic attachment arrangement it can be easily removed and replaced.

Figure 2:
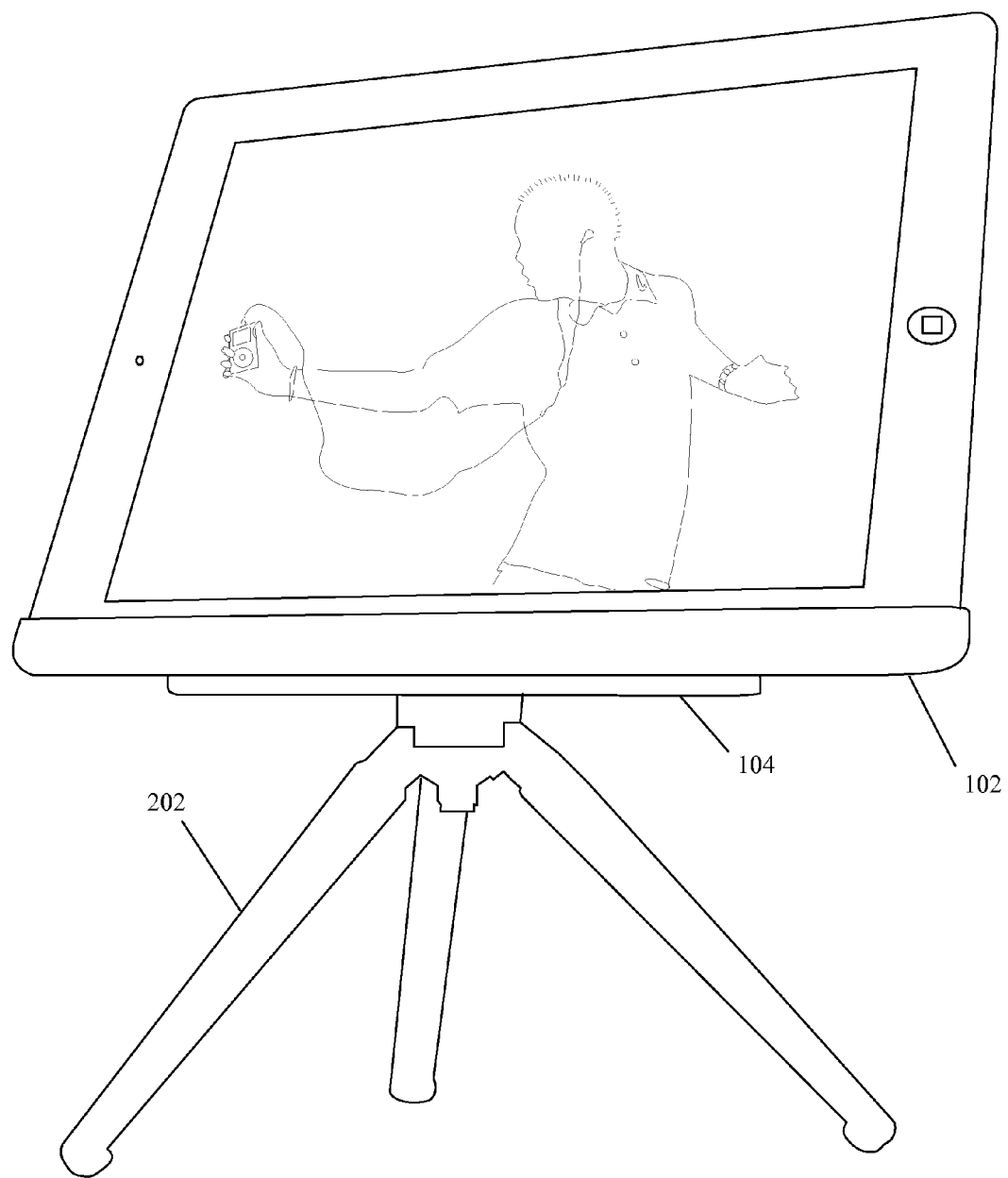
FIG. 2 shows a magnetic stand holding a tablet device mounted on a small tripod in accordance with the described embodiments.

FIG. 2 shows one use of the magnetic stand in accordance with the described embodiments. In this embodiment the magnetic stand is attached to a small tripod via a one quarter inch tripod mount. In this configuration the tablet can be used by a photographer or videographer for reviewing photos or video as they are taken. A wireless transmitter can send data between the camera and the tablet device via a Wi-Fi signal, Bluetooth protocol, or even through an alternative signal received by a wireless receiver attached to the tablet device. In this way a light and portable secondary display can be easily configured for reviewing and displaying products without having to bring along a larger laptop or desktop computer. This configuration can also be useful at a restaurant table allowing specials to be displayed; customers could then touch the displayed special, and then receive more information. If the device were also configured to accept orders the customers might decide to remove the device and enter further details such as table location or payment means into the tablet device.

Figure 3:
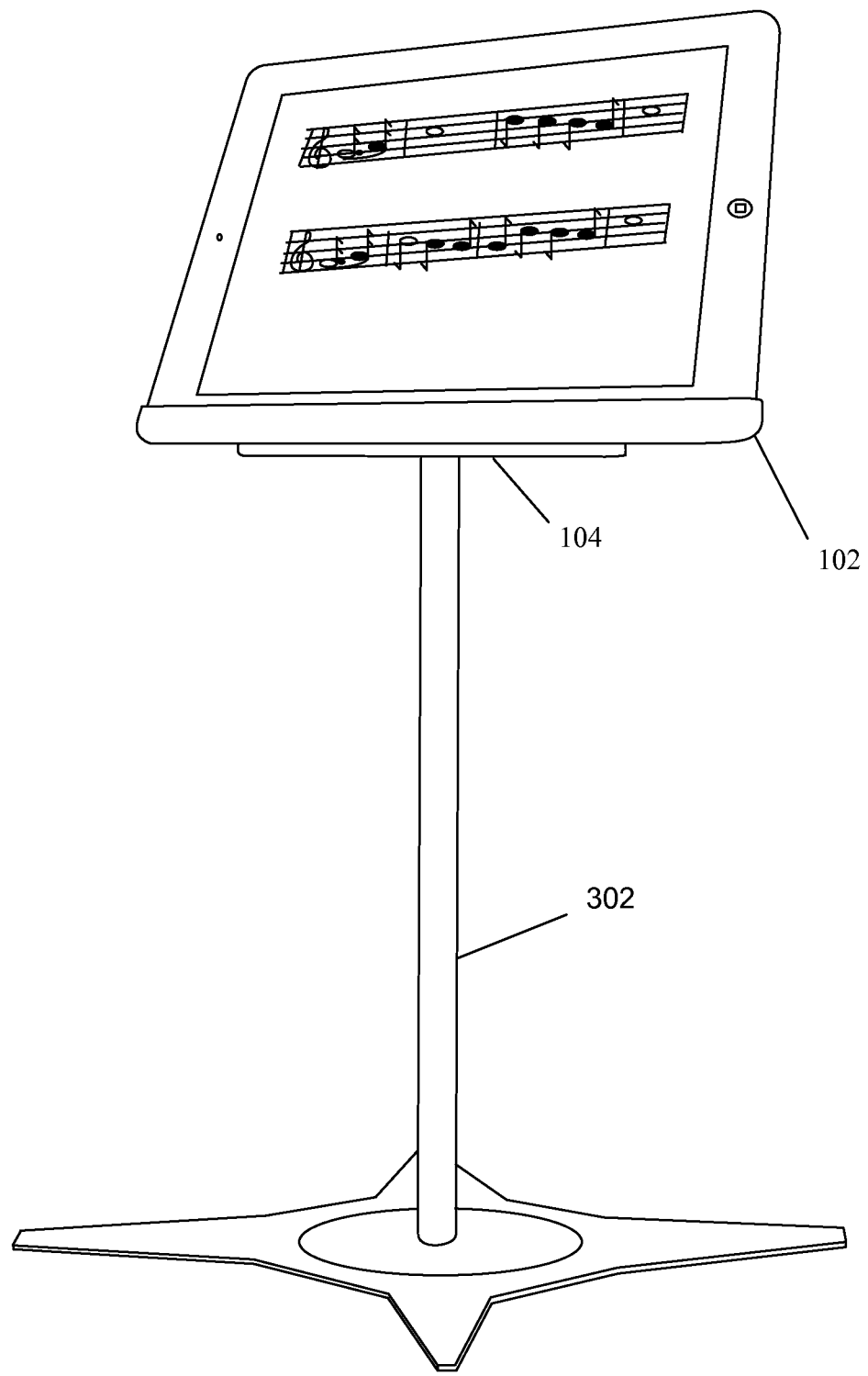
FIG. 3 shows a magnetic stand attached to the top of a music stand in accordance with the described embodiments.

FIG. 3 shows another use of the tablet device holder in accordance with the described embodiments. In this embodiment the tablet holder can be used to support a music stand used to display sheet music on tablet screen. In this way, the strong magnetic connection between the tablet and the tablet holder would allow for a musician to quickly swipe the screen when page turns are required, without having to worry about the possibility of knocking it off its support. A more advanced software configuration can allow the tablet device to turn the pages for the musician at appropriate points in the song. Another software implementation can allow the music to be advanced line by line. In another implementation a conductor can even wirelessly adjust the flow of the music played by a band with another stand mounted tablet, allowing the band to quickly adapt to last minute changes in a musical program.

Figure 4:
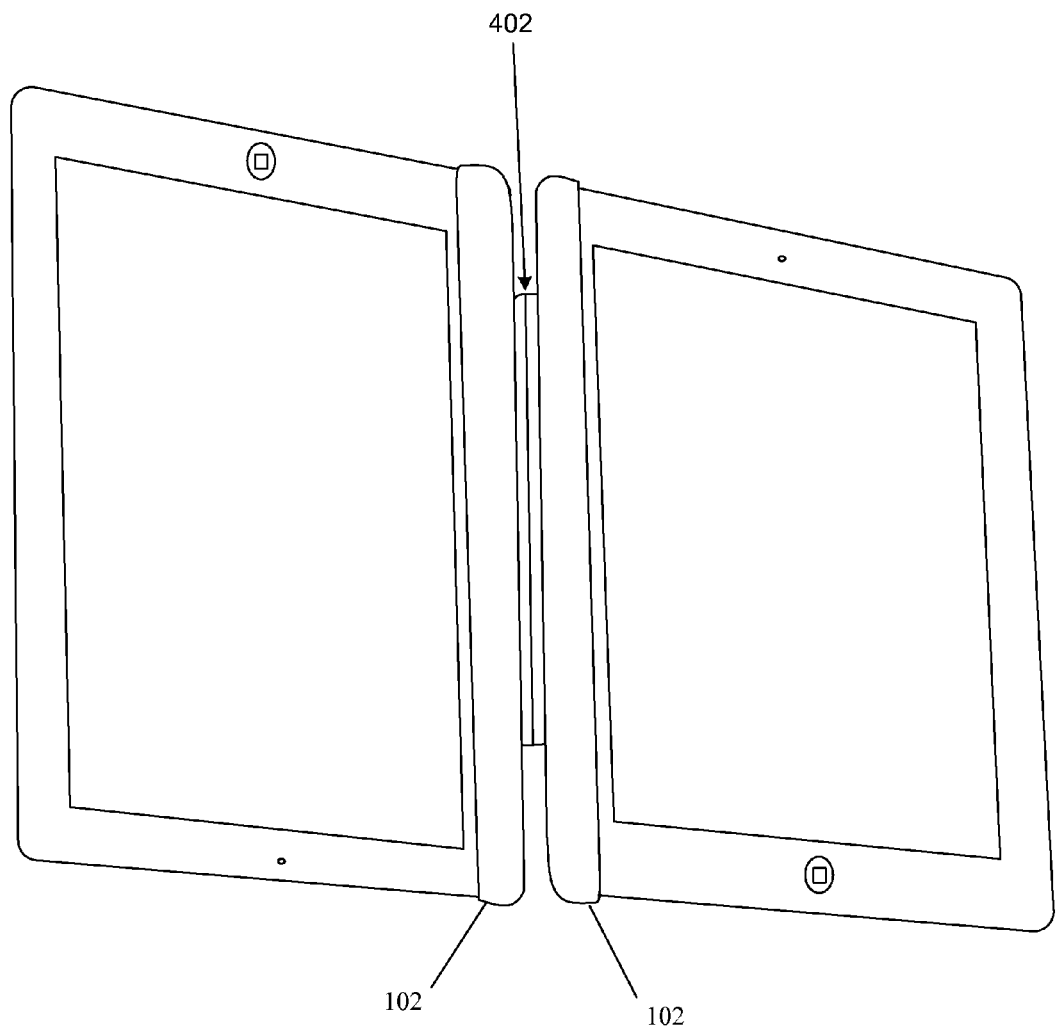
FIG. 4 shows an alternate embodiment of the magnetic stand with two attachment features linked by a hinge for use with two tablet devices.

FIG. 4 shows another embodiment of the tablet holder. In this embodiment the tablet device holder can be configured with two tablet devices secured together by stiff hinge 402. Tablet devices which only contain a strong set of magnets on one side of the enclosure can be inserted into the tablet device holder in alternating directions as shown in the figure to maximize the magnetic attraction forces. In this configuration the tablets can be configured to work together cooperatively. The cooperation can occur over a wireless channel, or the tablet devices can be configured to include a wired connector (not shown) allowing communication to run through a wire that runs between the devices and the connector. Once a communication channel is established the tablet devices can work together to allow activities like book reading or even be configured in more of a laptop arrangement. Without the extra magnetic power enabled by the cup portion of the tablet holder the tablet holder would not be strong enough to maintain a tablet in the orientation normally assumed by a laptop computer screen. In this way the described embodiment allows a user with two tablet devices to configure a virtual keyboard on one tablet device with a working document on the second tablet display.

Figure 5A:
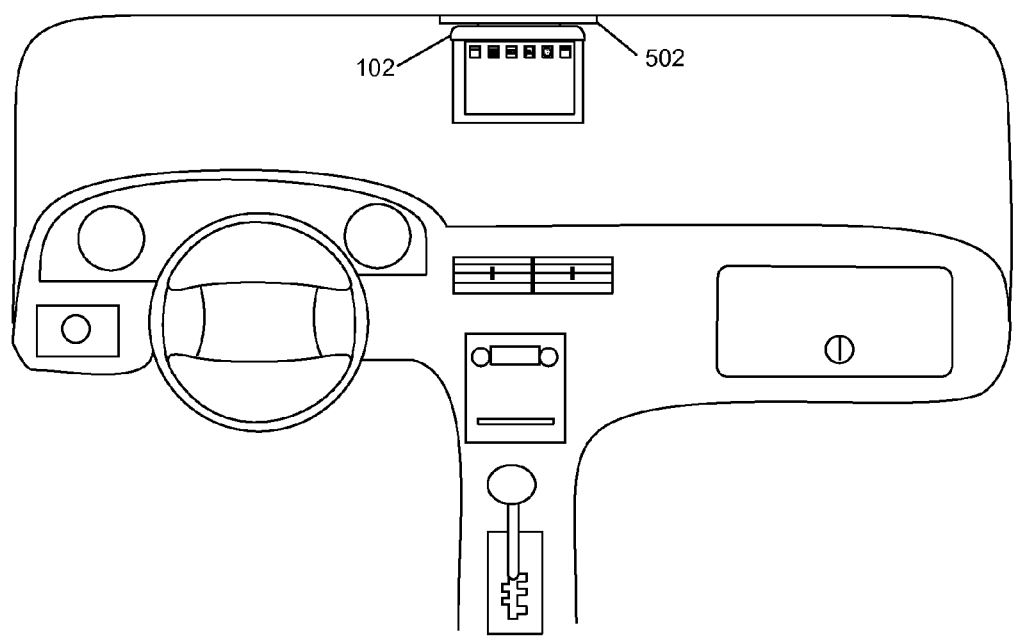
FIG. 5A shows a tablet device attached to the roof of a car with a magnetic stand in accordance with the described embodiments.
Figure 5B:
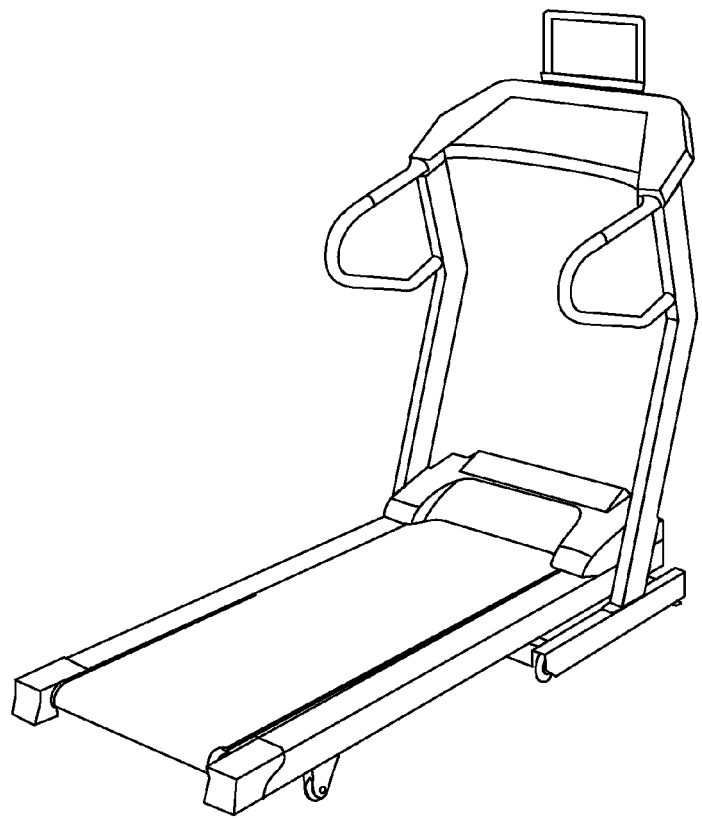
FIG. 5B shows a tablet device attached to a treadmill with a magnetic stand in accordance with the described embodiments.

In other embodiments of the magnetic stand accessory items can be securely attached to a tablet device. This might include devices such as video game controllers, physical keyboards, or even a robust stylus holder. In particular video game controllers need a strong connection to a tablet device to provide a robust control configuration for serious gaming enthusiasts. FIG. 5A shows a magnetic stand supporting a tablet device from above, mounted to vehicle console 502 of an automobile. This makes it easy for a passenger to securely mount the tablet device inside the car and to easily remove it before leaving the vehicle. A vehicle mounted tablet mount can allow a number of additional features to be built into the mount. In this way the tablet could automatically connect to electronic devices built into the car itself. Given prior setup and pairing, Bluetooth and WiFi radio connections could be established moments after the tablet was snapped into place. With these connections activated car manufacturers could allow navigation, backup camera video, music selection, or even vehicle performance data to be displayed in the tablet device. Since a majority of tablet devices include microphones, voice automation can allow drivers to safely interact with the device while driving. A magnetic stand is shown attached with a tablet device in this manner to vehicle console 502 and can be attached via a clutch hinge which would allow the tablet to fold up into vehicle console 502 while not in use. Hall Effect sensors built into the face of the tablet device could sense an additional magnet or magnets built into vehicle console 502 of the vehicle, and the resultant magnetic field can function as a signal to the tablet to automatically secure itself once the tablet is rotated up into the console in close proximity to those magnets, and then to reactivate itself once it is pulled back down, thereby conserving battery life and easing activation. In FIG. 5B a magnetic stand is configured on the front of a treadmill for watching a movie or a television show while jogging or walking. The tablet could also be configured to control various aspects of the treadmill.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A stand for magnetically securing a tablet device, the tablet device having a magnetic attachment system disposed within a first portion of a tablet device housing, the stand comprising:
    a cupped portion, comprising:
        an interior having a size and shape arranged to accommodate the first portion of the tablet device by providing a friction force to an exterior surface of the tablet device housing; and
    a magnetic attachment mechanism, comprising:
        a magnetic element for magnetically interacting with the magnetic attachment system, the magnetic interaction causing the cupped portion to secure the tablet device.

2. The magnetic stand of claim 1, further comprising:
    a metallic shunt portion attached to an exterior surface of the magnetic element for redirecting a portion of a magnetic field emanating from the magnetic element towards the interior of the cupped portion thereby increasing the magnetic interaction, the magnetic shunt portion securing the magnetic element within the cupped portion, wherein the metallic shunt portion includes a mounting connector.

3. The magnetic stand of claim 2, wherein the magnetic stand further comprises:
    a cupped portion door which prevents inadvertent insertion of objects into the cupped portion of the magnetic stand.

4. The magnetic stand of claim 2, wherein the magnetic element is a rare-earth magnet.

5. The magnetic stand of claim 4, wherein the mounting connector is a clip.

6. The magnetic stand of claim 4, wherein the mounting connector is compatible with a tripod mount.

7. The magnetic stand of claim 1, wherein the magnetic stand further comprises:
    a hinge portion which attaches to another metallic shunt portion which attaches to another cupped portion, wherein the magnetic stand is configured to attach two tablet devices together.

8. The magnetic stand of claim 7, wherein the magnetic stand further comprises:
    a data connector disposed on the inside surface of each cupped portion, wherein the tablet device has a corresponding data connector which enables wired communications between the two tablet devices.

9. A magnetic mount for releasably securing a tablet device to a vehicle console, the magnetic mount comprising:
    a mounting connector compatible with a vehicle attachment point on the vehicle console;
    a metallic shunt portion which positions a plurality of permanent magnets within the magnetic mount, and prevents a magnetic field emanating from the permanent magnets from leaking energy out of the back or sides of the magnetic stand;
    a cupped portion arranged to provide a friction force for rigidly supporting at least one side of the tablet device, and a structure for shielding the magnetic field emanating from the permanent magnets while the magnetic stand is not in use,
    wherein the metallic shunt is mechanically attached to a bottom outer surface of the cupped portion and further wherein the magnetic field acts to hold a portion of the tablet device securely within the cupped portion.

10. The magnetic mount of claim 9, wherein the mounting connector is hingedly attached to the vehicle attachment point.

11. The magnetic mount of claim 10, wherein when a display side surface of the tablet device is rotated against the vehicle console, the hinge attachment lines up a magnetic field sensor within the tablet device with a magnet in the vehicle console and deactivates the tablet device.

12. The magnetic mount of claim 11, wherein when a display side surface of the tablet device is rotated away from the vehicle console, a decrease in the magnetic field strength sensed by the magnetic field sensor within the tablet activates the tablet device.

13. The magnetic mount of claim 9, wherein recognition of the specific magnetic signature by the tablet device sensor directs the tablet device to activate a vehicle mode for initiating interaction and communication between the tablet device and the vehicle.

14. A detachable motor vehicle communication system, comprising:
   a tablet device comprising:
      a display for presenting visual information,
      a wireless communication interface, and
      a magnetic attachment mechanism; and
   a stand for detachably securing the tablet device to an interior surface of the motor vehicle, the stand comprising:
   a magnetic attachment unit that interacts with the magnetic attachment mechanism to secure the tablet device and the stand, wherein a sensor in the tablet device senses that the tablet device is secured to the stand causing the tablet device to automatically interact with the motor vehicle in a wireless mode.

15. The detachable motor vehicle communication system as recited in claim 14, wherein in the wireless mode, a microphone built in to the tablet device is activated for receiving audible commands, the audible commands directing the operation of the tablet device.

16. The detachable motor vehicle communication system as recited in claim 15, wherein the audible commands for changing the configuration of the car are passed from the tablet to the car.

17. The detachable motor vehicle communication system as recited in claim 15, the tablet device further comprising a navigation system operable to provide current navigation information, the navigation system responsive to at least one audible command.

18. The detachable motor vehicle communication system as recited in claim 14, wherein in the wireless mode the tablet device can display car status information.

19. The detachable motor vehicle communication system as recited in claim 15, wherein in the wireless mode the tablet device can transmit audio information to the motor vehicle stereo system.

20. The detachable motor vehicle communication system as recited in claim 15, wherein in the wireless mode the tablet device can display video information from a backup camera mounted on the motor vehicle.

* * * * *

UNITED STATES PATENT AND TRADEMARK OFFICE
CERTIFICATE OF CORRECTION

PATENT NO.         : 8,824,166 B2                                  Page 1 of 1
APPLICATION NO.    : 13/223110
DATED              : September 2, 2014
INVENTOR(S)        : Matthew D. Rohrbach It is certified that error appears in the above-identified patent and that said Letters Patent is hereby corrected as shown below:

In the Claims:

Column 6, line 9 (Claim 2, line 6): "magnetic shunt" should read --metallic shunt--.

Column 6, line 31 (Claim 8, line 3): "on the inside" should read --along an inside--.

Column 6, line 43 (Claim 9, line 9): "magnetic stand" should read --magnetic mount--.

Column 6, lines 47-48 (Claim 9, lines 13-14): "magnetic stand" should read --magnetic mount--.

Column 6, line 63 (Claim 12, line 3): "the magnetic" should read --a magnetic--.

Column 7, line 11 (Claim 14, line 8): "the motor vehicle" should read --a motor vehicle--.

Column 8, line 3 (Claim 16, line 3): "the car" should read --the motor vehicle--.

Column 8, line 4 (Claim 16, line 4): "tablet to the car" should read --tablet device to the motor vehicle--.

Column 8, line 15 (Claim 19, line 3): "the motor vehicle" should read --a motor vehicle--.

Signed and Sealed this
Thirteenth Day of January, 2015

Michelle K. Lee
*Deputy Director of the United States Patent and Trademark Office*